United States Patent
McCarty, Jr.

(10) Patent No.: US 7,027,498 B2
(45) Date of Patent: Apr. 11, 2006

(54) DATA ADAPTIVE RAMP IN A DIGITAL FILTER

(75) Inventor: Robert J. McCarty, Jr., Plano, TX (US)

(73) Assignee: CynTrust Communications, Inc., Dallas, TX (US)

( * ) Notice: Subject to any disclaimer, the term of this patent is extended or adjusted under 35 U.S.C. 154(b) by 761 days.

(21) Appl. No.: 09/774,832

(22) Filed: Jan. 31, 2001

(65) Prior Publication Data

US 2002/0136288 A1    Sep. 26, 2002

(51) Int. Cl.
*H03H 7/30* (2006.01)
(52) U.S. Cl. ............... 375/232; 375/350; 341/166; 708/300
(58) Field of Classification Search ............... 375/232, 375/261, 295–297, 312, 350, 354; 341/166; 330/149, 151; 455/456.1; 704/212, 230; 708/300
See application file for complete search history.

(56) References Cited

U.S. PATENT DOCUMENTS

| | | | | |
|---|---|---|---|---|
| 5,282,226 A | * | 1/1994 | Critchlow | 375/295 |
| 5,621,763 A | * | 4/1997 | Walczak et al. | 375/312 |
| 6,625,227 B1 | * | 9/2003 | Shull et al. | 375/295 |

FOREIGN PATENT DOCUMENTS

AU    200069704 A1 * 11/2000

\* cited by examiner

*Primary Examiner*—Young T. Tse
*Assistant Examiner*—Edith Chang
(74) *Attorney, Agent, or Firm*—Dan Brown Law Office; Daniel R. Brown

(57) ABSTRACT

A system and method for improving the performance of digital filters. The data bandwidth and spectral control are improved by adaptively selecting ramp-up and ramp-down symbols based on the actual filtered data. Thus, the energy in the truncated tail of the filter is minimized for a given filter design. The invention is of particular utility in systems that filters intermittent data streams, thus requiring the filter to energize and deenergize repeatedly.

4 Claims, 9 Drawing Sheets

DATA ADAPTIVE RAMP IN A DIGITAL FILTER

BACKGROUND OF THE INVENTION

1. Field of the Invention

The present invention relates to digital systems. More specifically, the present invention relates to digital filters used to control bandwidth in a communication system.

2. Description of the Related Art

Modern communication systems have evolved from using predominantly analog circuitry to predominantly digital circuitry over the past several years. Where there use to be passive and active analog circuits used to oscillate, mix, filter and amplify signals in 'analog' domain, there are now digital signal processing circuits that employ specialized microprocessors, DSP's and related circuits to process signals in the digital domain. At the circuit component level, digital circuits are much more complex, employing millions of devices in some circumstances. However, at the device level, digital communications circuits are much simpler, often times using just a handful of devices to accomplish a complex communications task. Portable wireless devices are good examples of this high level of integration. Digital communications circuits also provide the substantial benefit of programmability. A single device can serve many functions over time, allowing the system designer to closely tailor the function of the communications system to the needs of the effort at hand.

One particular functional area that has benefited from the transition to the digital domain is signal filtering. As system designs have become more stringent, with narrowing bandwidths and higher information rates, analog filter topologies had become very complex, expensive, and prone to parts and circuit tolerance limitations. Analog filters become rather poor choices when narrow bands, close channelization, and high information rates force the need for very high order filters to meet system design criteria. Fortunately, the advent of digital signal processing and digital filter theory has alleviated this problem to a great degree. However, digital filters are not without their own limitations, and the state of the art has evolved to the point where even digital filter designs are challenged to meet tight system requirement.

A particular family of filters that is commonly employed in digital communication systems implemented with digital filtering technology is the finite impulse response, or 'FIR', filter. These filters are often characterized by linear phase response and constant group delay without feedback. In a typical implementation, a FIR filter response is implemented as a number of taps in a time domain delay line, each tap having an associated coefficient that defines the filter response characteristics. The number of taps indicates the order of the filter, as well as the amount of processor overhead that is required to implement the filter. The implementation of a FIR filter in a digital signal processor is widely understood by those skilled in the art. In fact, commercial software applications exist that allow designers to enter desired filter response parameters and then quickly produce filter tap coefficients that meet the design characteristics. Digital signal processing devices offer low level instructions designed to make filter implementation as efficient as possible.

As is understood by those skilled in the art, digital filters, like any filter, can be represented in the frequency domain or the time domain. In the frequency domain, segments of the filter transfer function are delineated as the pass band, stop band and transition band in a typical high-pass, low-pass, or band-pass filter. The frequency domain can be readily transformed to the time domain. In the time domain, the filter response is represented by an impulse function. A filter designed in the frequency domain with a fixed frequency cutoff has a theoretically infinite time impulse response to fully realize the cutoff frequency. Since time is always constrained, the impulse function must be truncated. However, truncating the time domain necessarily results in a broadening, or splattering, of energy bandwidth in the frequency domain. Where a filter is used to control bandwidth, as in channelizing a communications signal, this splattering of energy can result in undesirable interference, noise, reduced system performance, and violation of FCC regulations. The problem is of particular concern in any system where the communications of information must be started and stop with any regularity. A digital filter requires time to ramp up and produce useful output. Thus, there is a period of time at the beginning and end of each transmission block of information which does not contribute to the communications of useful information through the system. In effect, the data throughput performance of the system is compromised by the filter's limitations.

There are certain techniques available to those skilled in the art for controlling this limitation of digital filter systems. One technique is to further truncate the filter at the beginning and ends of transmission periods. This results in reduced system noise immunity and spectral spreading for those periods, but can be employed to advantage none the less. Another technique is to reduce the ramp-up and ramp-down periods for the filter and control the resultant spectral spreading by truncating and windowing the data for the ramp periods. In effect, the energy is forced to zero at the very beginning and ending moments of a time slot of signal transmission. Even given these techniques, the system designer is forced to exchange spectral efficiency for data bandwidth performance in such systems. Thus, there is a need in the art to improve data throughput, by reducing ramp up and ramp down time performance in digital communication filters while maintaining control of spectral performance.

SUMMARY OF THE INVENTION

The need in the art is addressed by the systems and methods of the present invention. An apparatus for reducing output energy and bandwidth of an intermittent data stream through a digital filter is disclosed. The apparatus comprises a digital filter and a controller coupled to the digital filter and operable to calculate at least a first ramp data field in accordance with coefficients selected to minimize energy in a truncated tail of the digital filter as a function of at least a first data field. In a refinement of this apparatus, the first data field is adjacent to the ramp data field. In a further refinement, the controller is further operable to window the ramp data field. In a further refinement, the controller is further operable to calculate both of a ramp-up and a ramp-down ramp data field as a function of the at least a first data field and a second data field respectively, and the ramp-down coefficients are the mirror image of the ramp-up coefficients, provided that the digital filter is symmetrical.

Another apparatus is disclosed and serves the purpose of generating coefficients (based on the digital filter tap weights) that are used to calculate ramp symbols. The coefficients are derived by minimizing energy in the at least a first truncated tail data field as a function of at least a first data field, and at least a first ramp data field. At least a first coefficient is derived by setting the partial derivative of the energy of the at least a first truncated tail data field with respect to at least a first ramp data field equal to zero, and solving the equation for the at least a first ramp data field. The coefficient of the at least a first data field in the solution represents the at least a first coefficient in the solution for an arbitrary at least a first data filed. The present invention teaches and claims a method for reducing the energy in the truncated tail of a filter response to a burst data by adaptively calculating ramp symbols as a function of the data input to the digital filter.

A first method comprises the step of calculating at least a first ramp data field in accordance with coefficients selected to minimize energy in a truncated tail of the digital filter as a function of at least a first data field. In a refinement of this method, the at least a first data field is adjacent to the ramp data field. In another refinement, the method also includes the step of windowing the ramp data field. In a further refinement, the calculating step is applied to both of a ramp-up and a ramp-down ramp data field as a function of the at least a first information data field and a second information data field respectively, and wherein ramp-down coefficients are the mirror image of the ramp-up coefficients.

Another method taught by the present invention comprises the steps of calculating the energy in at least a first truncated tail data field as a function of at least a first ramp data field variable and at least a first data field variable, and taking a partial derivative of the energy in the at least a first truncated tail data field with respect to the at least a first ramp data field variable. Then, writing an equality by setting the partial derivative equal to zero, and solving the equality for the at least a first ramp data field variable as a function of the at least a first information data field thereby generating at least a first coefficient. In a refinement of this method, the energy in the at least a first truncated tail data field is also a function of the digital filter tap coefficients.

DESCRIPTION OF THE INVENTION

Illustrative embodiments and exemplary applications will now be described with reference to the accompanying drawings to disclose the advantageous teachings of the present invention. While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
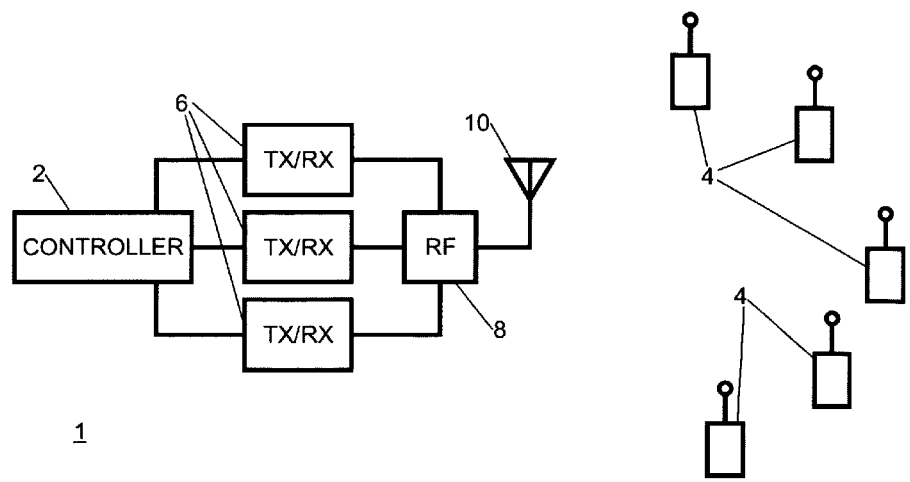
FIG. 1 is a block diagram of a radio communications system used in an illustrative embodiment of the present invention.

The preferred embodiment utilizes the present invention in a trunked land mobile radio system that employs FDM channelization and TDMA packetized data for channel trunking management, system control, data communications, and voice communications. Reference is directed to FIG. 1, which is a block diagram of such a system. The system includes a repeater base station 1 and a number of radio terminal units 4. The base station 1 has a controller 2, which serves to control and interconnect several radio repeaters 6. In FIG. 1, three repeaters are shown, however, those skilled in the art understand that the number of repeaters is dependent upon the radio spectrum allocated to the system and may range form one to twenty, or more, radio channels, and hence, one to twenty or more radio repeaters 6. In the United States, spectrum allocation is under the control of the Federal Communications Commission (FCC). The controller 2 provides various kinds of control of the resources in the base station 1, including interconnecting radio and wireline communications resources, and generating and interpreting communication protocols. The base station 1 includes radio frequency distribution and combining circuits 8 which interconnect the several radio repeaters 6 to one or more transmit/receive antennas 10.

Figure 2:
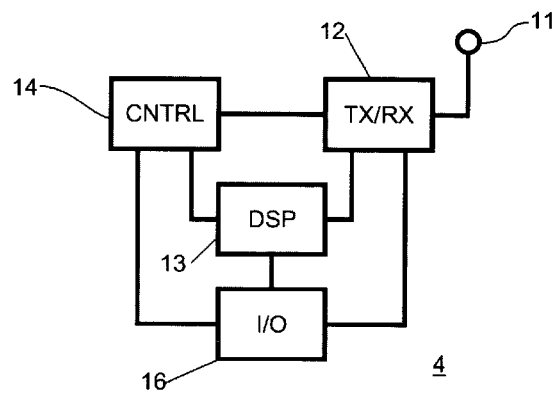
FIG. 2 is a block diagram of a radio terminal unit used in an illustrative embodiment of the present invention.

The terminal units 4 communicate via radio frequency waves (not shown) with base station 1 via antenna 10. Reference is directed to FIG. 2, which is a functional block diagram of a typical terminal unit 4. In the preferred embodiment, the terminal unit includes a controller 14 interconnected to a radio transceiver 12, which couples through an antenna 11 to the base station 1. The terminal unit controller 14 provides various control functions in the terminal unit including managing the channel trunking operations, system control, data communications, and voice communication through the terminal unit 4. The controller 14 also interfaces with a man-machine interface 16 (I/O) that allows for user interaction with the terminal unit 4. The man-machine interface includes audio input and output, user selectable functions, data input and output and so forth, as is understood by those skilled in the art. The terminal unit also comprises a digital signal processing device 13 (hereinafter 'DSP') which is coupled to the controller 14, the man-machine interface 16, and the radio transceiver 12. Because the terminal unit 4 operates in multiple modes of operation, with a large number of system and user features, and according to a protocol with various utilizations of data communications, the DSP 13 greatly simplifies the hardware design by providing for programmable flexibility. Of particular interest, with respect to the present invention, is the use of the DSP as a data filter to limit transmission bandwidth in the terminal unit transmit mode.

Figure 3:
FIG. 3 is a diagram of the radio spectrum utilized in an illustrative embodiment of the present invention.

In the preferred embodiment, the land mobile radio system operates in the US SMR band of frequencies that are allocated by the FCC. Reference is directed to FIG. 3, which is a spectral diagram 18 of a typical spectrum allocation in the SMR band of frequencies. The US SMR band is defined as the ranges of frequencies from 806 MHz to 821 MHz and from 851 MHz and 866 MHz. Both ranges of frequencies are divided into 25 kHz channels with the lower range of frequencies being referred to as 'reverse' channels and the higher range of frequencies as 'forward' channels. Forward channels being utilized for transmission from the base station to the terminal units and reverse channels for transmissions from terminal units to base stations. Following the three channel example used above, the spectrum 18 has three reverse channels 20, which are typically assigned at one megahertz intervals, in the range of frequencies from 806 MHz to 821 MHz, and, three forward channels 22 in the range of frequencies from 851 MHz to 866 MHz. The channels are paired, one forward channel with one reverse channel, and offset from one another by 45 MHz. It is understood that any suitable band of frequencies would be usable in the preferred embodiment, such as the VHF band, the UHF band, or any other radio band.

Figure 4:
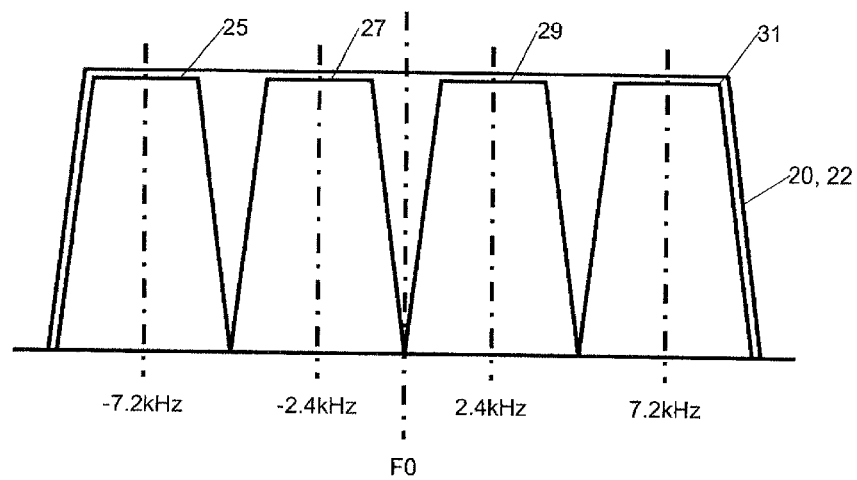
FIG. 4 is a spectral diagram in an illustrative embodiment of the present invention.

In the preferred embodiment, the allocated channels are advantageously sub-divided to improve capacity as is illustrated in FIG. 4. Each of the reverse radio channel bands 20 (and each of the forward channel bands 22) centered about frequency F0 are subdivided with four sub-bands 25, 27, 29, and 31. Sub-band 29 is offset from the center frequency F0 by 2.4 kHz, sub-band 27 is offset from the center frequency F0 by -2.4 kHz, sub-band 31 is offset from the center frequency F0 by 7.2 kHz, and sub-band 25 is offset from the center frequency F0 by -7.2 kHz. Each of the sub-carriers is independently modulated and independently utilized as a communications resource. Since each sub-band is further subdivided into two independent times slots, up to eight terminal units may occupy each allocated radio channel because each will receive and transmit within one-half of the four sub-bands. For a more thorough description of the channelization scheme, attention is directed to co-pending U.S. patent application Ser. No. 09/295,660 filed Apr. 12, 1999 entitled BANDWIDTH EFFICIENT QAM ON A TDM-FDM SYSTEM FOR WIRELESS COMMUNICATIONS, assigned to the same assignee as the present invention, the contents of which is hereby incorporated by reference thereto.

It should be noted in FIG. 4 that the band allocation 22 of the reverse band and its transmission mask are defined by FCC regulations within Title 47 of the Code of Federal Regulations. Thus, any transmitting terminal unit must control its transmission bandwidth so as not to exceed the allocated band and mask constraints. Additionally, since each allocated band 20 in the preferred embodiment is further subdivided, each transmitting mobile must also control its modulation, or limit frequency splatter, so as not to interfere with other terminal units transmitting on adjacent sub-bands. It will be appreciated by those of ordinary skill in the art that the sub-band channelization in the preferred embodiment defines a narrow-band system that challenges the system designer in developing a robust product that does not cause undue inter-channel or inter-sub-band interference.

Figure 5:
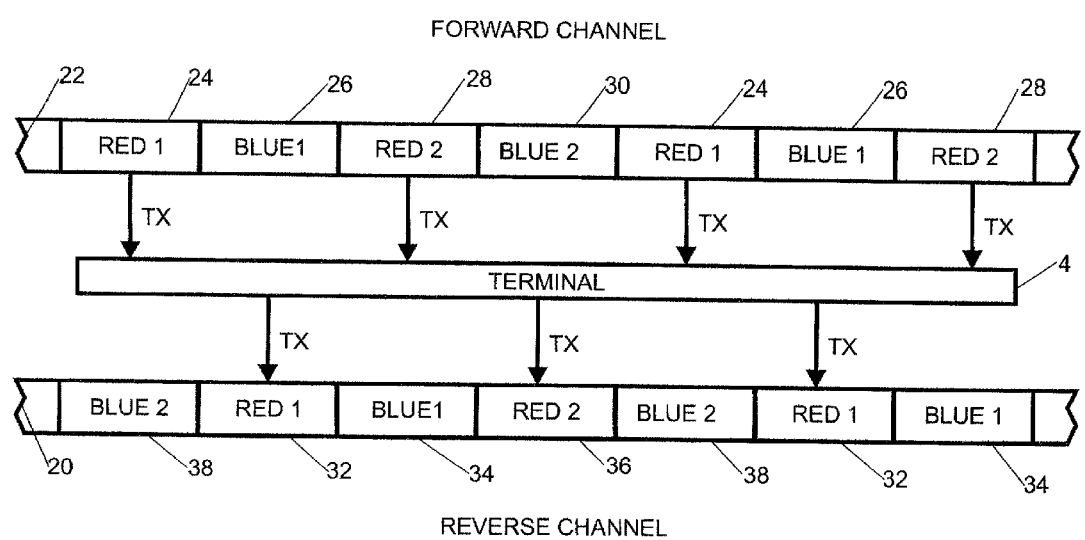
FIG. 5 is a diagram of the TDMA data packet arrangement in an illustrative embodiment of the present invention.

A further advantageous use of the radio spectrum within the preferred embodiment is illustrated in FIG. 5. Each of the sub-carriers are digitally modulated and time division multiplexed to allow two, or more, communications sessions to co-occupy the same radio frequency sub-band. One sub-channel of a forward channel 22 and the corresponding sub-channel of a reverse channel 20 are illustrated in FIG. 5. Each communication session comprises a stream of data packets that are transmitted on the appropriate channel and sub-channel as are defined by the system protocol. The data transmitted includes channel trunking and control data, data communications data, and digitized voice data, which are all interleaved within the data packets. The two discrete TDM communication sessions are arbitrarily defined as the RED and BLUE sessions. In the preferred embodiment, the individual sessions are further segmented into a first and second TDM packet slot, thus in the continuous stream of data packets there are RED1, BLUE1, RED2 and BLUE2 data slots. Therefore, as illustrated in FIG. 5, the forward channel 22 comprises a stream of data slot packets transmitted by the base station as RED1 24, BLUE1 26, RED2 28 and BLUE2 30, which repeat indefinitely. Similarly, the reverse channel 20 comprises a stream of data slot packets transmitted by the terminal units as RED1 32, BLUE1 34, RED2 36 and BLUE2 38, which also repeat indefinitely, so long as the terminal units are transmitting. During idle periods, the reverse channels may be quiet, or just a fraction of the TDM slots may be occupied from time to time.

In operation, the terminal units, illustrated as block 4 in FIG. 5, alternate between receiving a data slot packet on the forward channel and transmitting a data slot packet on the reverse channel. For efficient terminal unit communications, the timing relationship between the forward channel and reverse channel is staggered so that the forward channel RED packet slots align in time with the reverse channel BLUE packet slots. So, when a terminal is assigned to the RED slot, then the terminal receives during the outbound RED slot and the terminal transmits during the outbound BLUE slot. The transmit/receive switching in the terminal units is thus efficiently managed.

Figure 6:
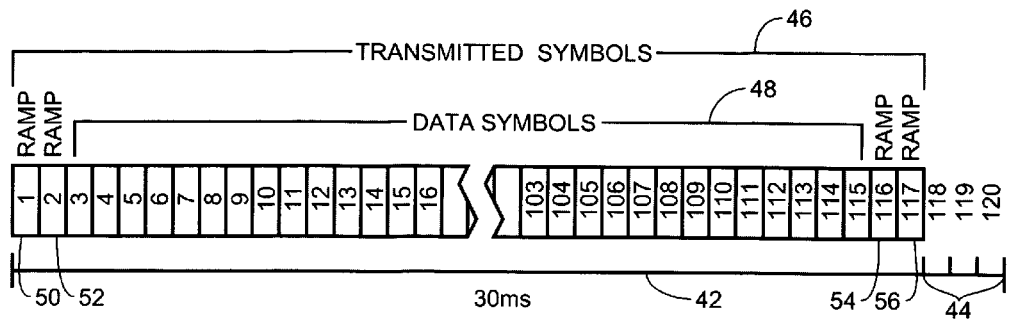
FIG. 6 is a diagram a single TDM frame in an illustrative embodiment of the present invention.

Reference is directed to FIG. 6, which illustrates the data field content and general packet timing aspects of the terminal unit transmit packet 40 according to the preferred embodiment of the present invention. The window duration for each of the aforementioned TDMA slots according to the preferred embodiment of the present invention is thirty milliseconds, 42 as illustrated in FIG. 6. Since the distance between the terminal unit and the base station can range from nearly zero to twenty or more miles, it is necessary to factor in the propagation delay of the radio signals. This is accomplished by turning off the terminal unit transmitter before the end of the TDMA time window occurs, thus allowing time for the entire data content of each packet to propagate from the terminal unit to the base station receiver within the TDM slot time reference at the base station. In the preferred embodiment, the thirty millisecond TDMA window 42 is arbitrarily divided into one hundred twenty data field periods (250 microseconds each) which are numbered from one to one hundred twenty. Thus, respecting the propagation issue, the terminal unit is turned off during the last three data field periods 44 in the preferred embodiment.

Turning off the transmitter for the last three data fields reduces the total number of transmitted data fields to one hundred seventeen 46. The first and last two of these fields, identified as items 50, 52, 54, and 56, are used to ramp up and ramp down the digital filter to control spectral splattering, which concept will be more fully developed hereinafter. Therefore, the data fields remaining for transmission of usable data are one hundred twelve 48, as are indicated by data field numbers three through one hundred fifteen in FIG. 6. The content and use of the data symbols 48 are detailed in co-pending U.S. patent application Ser. No. 09/295,660 to West for BANDWIDTH EFFICIENT QAM ON A TDM-FDM SYSTEM FOR WIRELESS COMMUNNICATIONS.

The preferred embodiment utilizes a sixteen-point constellation quadrature amplitude modulation scheme (hereinafter 'QAM') for the encoding of data onto the radio frequency carrier. Therefore, each point on the constellation defines one of sixteen data values, which are mapped to four-bit data fields, generally called 'symbols' by those skilled in the art. In FIG. 6, each of the data fields is used to transmit a single symbol, so the terms 'data field' and 'symbol' can be used interchangeably respecting the preferred embodiment, and other implementations of the present invention.

Figure 7:
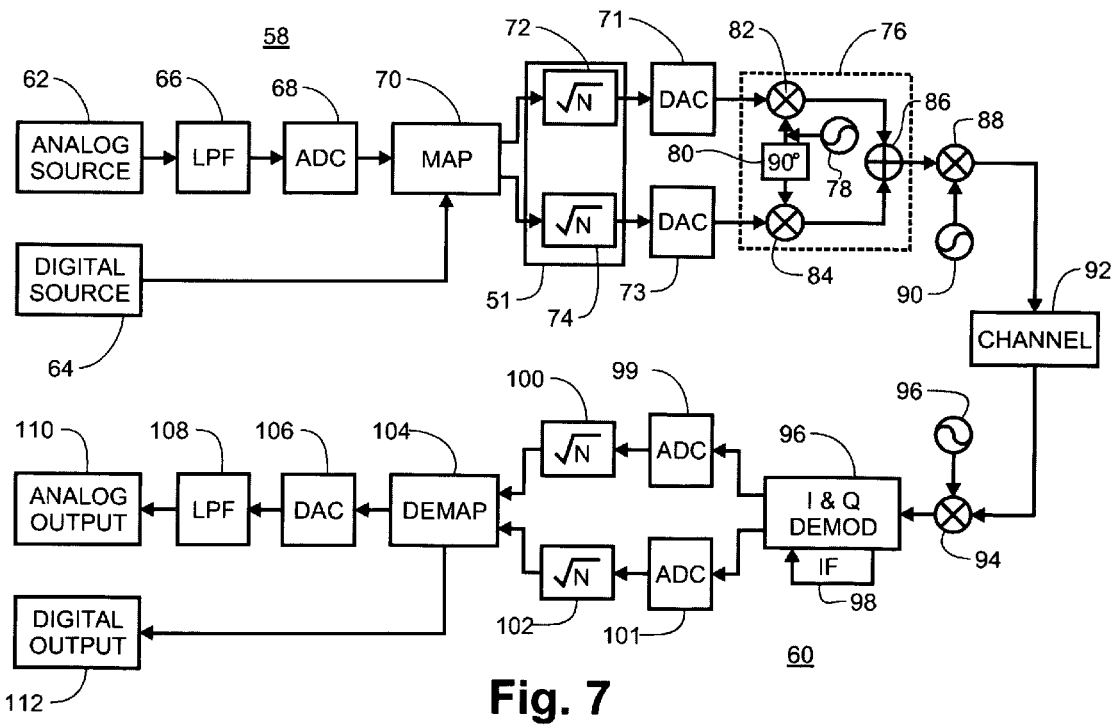
FIG. 7 is a functional block diagram of a transmitter/receiver system in an illustrative embodiment of the present invention.

Reference is directed to FIG. 7, which is a functional block diagram of a transmitter circuit 58 and a receiver circuit 60 coupled together with a communications channel 92, according to an illustrative embodiment of the present invention. In the transmitter circuit 58, either digitally sourced data 64 or analog sourced information 62, such as audio signals, are coupled into the transmitter. Analog information 62 is first filtered by low pass filter 66 to limit its bandwidth. The filtered signal is then digitized by analog to digital converter 68. The digitized analog signal is then coupled with digitally sourced information 64 into mapping circuit 70. The concepts involved in pulse timing, bit organization, and mapping of digital signals into the constellation of a QAM modulator are well understood by those skilled in the art. For reference, however, attention is directed to W. T. Webb and L. Hanzo, *Modern Quadrature Amplitude Modulation*, IEEE Press, 1994, chapter 3, pp. 80–93, the contents of which are hereby incorporated by reference thereto.

Mapping circuit 70 produces two digital outputs for the in-phase and quadrature-phase inputs of the QAM modulator 76, which are coupled to a pair of Nyquist filters 72 and 74. The Nyquist filters are implemented as 65-tap finite impulse response (hereinafter 'FIR')filters in a DSP in the preferred embodiment. Actually, since a Nyquist filter impulse response is used to reduce inter symbol interference at the output of the modulator 76, the filters 72 and 74 generate a square-root Nyquist response output, accomplished mathematically in the DSP. In preparation to modulation in the analog domain, the digital signals output by the square-root Nyquist filters 72 and 74 are converted to the analog domain by digital to analog converters 71 and 73 respectively. These signals are multiplied in the modulator 76 to produce the desired Nyquist filter response characteristics. Within the modulator 76 is an intermediate frequency (hereinafter 'IF') reference oscillator 78 that drives a first mixer 82. The filtered signal from Nyquist filter 72 is thus mixed with the IF in mixer 82. The IF oscillator 78 is also coupled through a 90° phase shift circuit 80, which in turn couples to the second mixer 84. The output of the second Nyquist filter 74 is mixed with the phase-shifted IF signal in mixer 84. The two modulated IF signals are combined in adder 86 and output as a QAM modulated IF signal from modulator 76. Finally, the QAM modulated IF signal is mixed with a signal from a radio frequency (hereinafter 'RF') oscillator 90 in mixer 88, which outputs the QAM modulated RF carrier. The RF carrier is coupled to the receiver circuit 60 via channel 92. In the preferred embodiment, the channel 92 is via radio wave propagation.

The receiver circuit 60 in FIG. 7 performs essentially the reverse functions of the transmitter circuit 58. The QAM modulated RF signal is received from channel 92 and coupled to a mixer 94 that is excited by a RF oscillator 96. The resultant QAM modulated IF signal is coupled to I&Q demodulator 96 which serves to recover the IF phase 98 and to produce corresponding in-phase and quadrature-phase outputs at the baseband. These analog signals are coupled to analog to digital converters 99 and 101 which convert the signals to the digital domain prior to subsequent coupling to square-root Nyquist digital filters 100 and 102 respectively. The outputs of Nyquist filters 100 and 102 comprise the received digital symbols, which are coupled to demapping circuit 104. The received symbols are demapped and output directly as digital signals 112, or coupled though digital to analog converter 106 and filtered by low pass filter 108 to an analog output 110.

The advantages of using Nyquist filters in digital communications systems are well understood by those of ordinary skill in the art. With the advent of digital signal processing technology, Nyquist filters are now commonly implemented as digital filters written as software applications for a DSP, ASIC, or FPGA. Many are implemented as multi-tap FIR filters, often times of the raised-cosine variety. Naturally, along with the advantages of DSP technology and digital filtering, there are certain limitations to be managed as well.

Major objectives of the design of the baseband digital filter system are to choose the transmitting and receiving filters to minimize the effects of noise, eliminate or minimize inter-symbol interference and to reduce stop band energy. Inter-symbol interference can theoretically be eliminated by proper shaping of the impulse response characteristics of the transmitted signal. See FIG. 8B for reference. This shaping can be accomplished by causing the pulse to have zero magnitude at periodic intervals equal to the symbol/information rate (the Nyquist criteria). Thus, as each transmitted impulse is overlaid in time with those before and after, the impulse for each falls at times of zero energy for the others.

Modern implementations of pulse shaping filters use a pair of matched filters, one in the transmitter and one in the receiver. The convolution of the transmit filter with the receive filter forms the complete pulse shaping filter. Inter-symbol interference is avoided since the combined filter impulse response reaches unity at a single point and is zero periodically at every other information point (the Nyquist symbol/information rate). The linear superposition of pulses representing a pulse train preserves bandwidth and information content. Linear superposition of band limited pulses remains band limited and sampling the combined filter at the information rate at the correct sampling point recovers the information.

Zero crossings of the impulse response function of a Nyquist filter occur at the information rate, except at the one, center, information bearing point. All Nyquist filters having the same stop band are theoretically equally bandwidth limited if the time response is allowed to go to infinity. Realizable filters, however, are truncated in time since it is not possible to have infinitely long impulse responses. With respect to the preferred embodiment, where a TDMA technique is employed, the time domain is even more limited in that the terminal unit transmit energy should be at zero at the beginning and end of each 30 ms transmit window. Truncation error in the time domain causes the theoretical stop band achievable by a Nyquist filter to be violated, so that out of band energy exists in excess of the stop band frequency. A well designed Nyquist filter balances this trade-off efficiently given system design criteria and the general need to obtain the best possible data performance of the system.

Figure 8A:
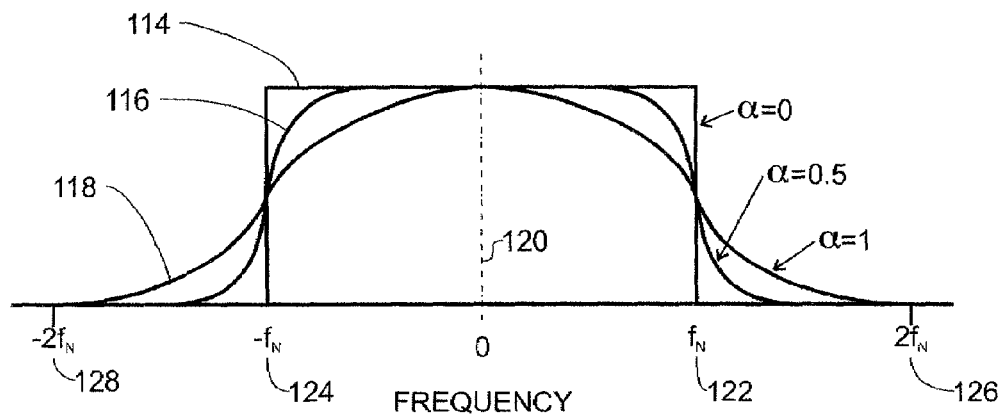
FIG. 8A is a diagram of the frequency responses curves of an illustrative embodiment digital filter.

The most efficient filter is the "brick wall" filter illustrated in FIG. 8A, where α=0 114. The stop-band transition is tightly cut-off at $-f_N$ 124 and $f_N$ 122. While the bandwidth efficiency is theoretically greatest for a brick wall filter as time approaches infinity, truncation error causes poor performance for practicable and realizable approximations to the brick wall filter. One method of producing practical filters is to allow the stop band of Nyquist compliant filters to exceed the bandwidth of the ideal brick wall filter and smoothly transition to the stop band. A class of such filters is the raised-cosine filter. In the frequency domain, the raised cosine filter is continuous in the stop band.

To produce a realizable filter, the ideal filter is approximated by time delaying and truncating the infinite impulse response. Truncation, however, produces unintentional out of band energy in excess of the theoretical stop band. One goal that is achieved by the present invention is to minimize this undesirable out of band energy after the filter is truncated.

Figure 8B:
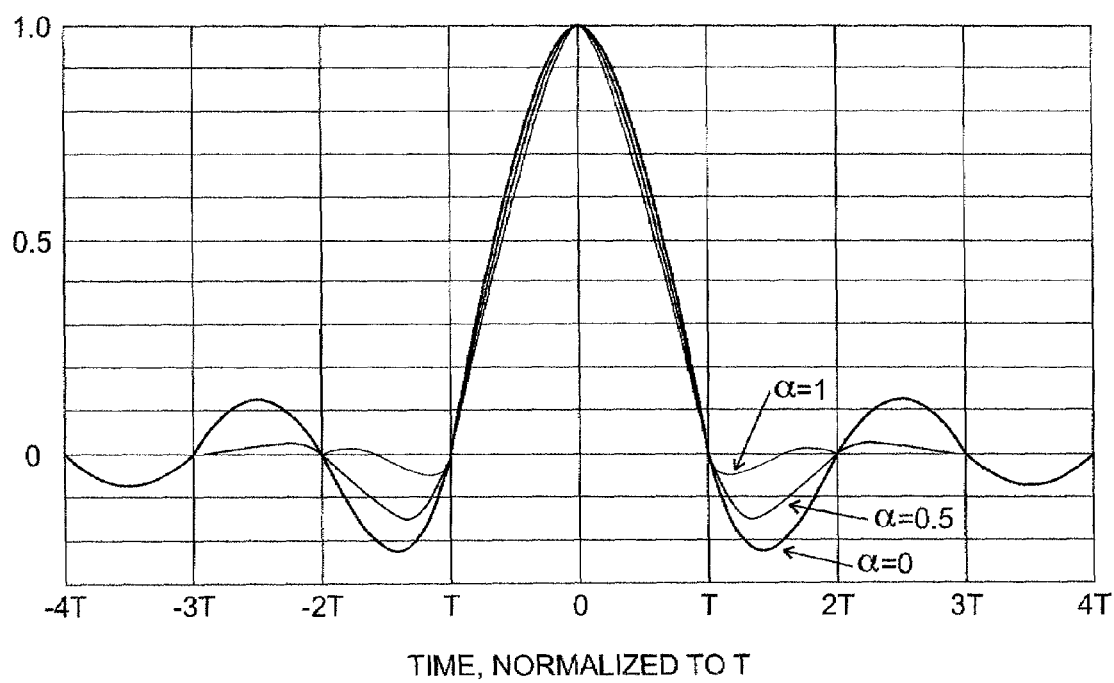
FIG. 8B is a diagram of the time domain impulse response of an illustrative embodiment digital filter.

Attention is directed to FIGS. 8A and 8B. A Nyquist filter has an impulse response with equidistant zero-crossing points to eliminate inter-symbol interference. Nyquist showed that any odd-symmetry frequency domain extension characteristic about $f_N$ 122 and $-f_N$ 124 yields an impulse response with a unity value at the correct signaling instant and zero crossing at all other sampling instants. The raised-cosine characteristic meets these criteria by fitting a quarter period of a frequency-domain cosine shaped curve to an ideal (brick wall) filter characteristic.

The parameter controlling bandwidth of the raised cosine Nyquist filter is the roll-off factor α. The roll-off factor α is one (α=1) 118 if the ideal low pass filter bandwidth is doubled, that is the stop band goes to zero at twice the bandwidth $2f_N$ 126 (and $-2f_N$ 128) of an ideal brick wall filter at $f_N$. If α=0.5 116 a total bandwidth f $1.5f_N$ (not shown) would result, and so on. The lower the value of the roll-off factor α, the more compact the spectrum becomes but the longer time it takes for the impulse response to decay to zero. FIG. 8 illustrates three cases, namely when α=0 114, α=0.5 116, and α=1 118.

In the time domain, referencing FIG. 8B, the impulse response of the Nyquist filter is greatest at zero and crosses zero at every integer multiple (both positive and negative) of the symbol/information period 'T'. The energy in the tails is greatest where α=0, less when α=0.5, and even less where α=1. These reductions in the tail energy levels are inversely proportional to the amount of out of band, or stop-band energy.

In the preferred embodiment, the Nyquist filter is implemented as a digital filter at a 65 times oversample rate. The truncation length is eight symbol periods long, or sixteen total symbol periods, giving the number of the number of taps as sixteen times sixty-five, or one thousand twenty-four total taps. The filter is implemented in polyphase form, where the unique data inputs occur at the symbol rate. Polyphase implementation of digital filters is a well known digital technique to those of ordinary skill in the art. Theoretical Nyquist filters are not realizable (since infinite time in both directions is necessary to fully realize the theoretical stop band properties of the filter). Practical Nyquist filters are made by time delaying and truncating the infinite impulse response. After choosing the a factor, the over-sample rate (65) and the number of symbol time delays for the filter to realize the symbol value (8), fully specifies the filter tap values for the example raised cosine class of filters.

Given the digital filter design and the eight period decay time, out of band energy is naturally controlled to the filter's digital/truncation limit, according to the α factor selected in the design. However, since the filter operates in a TDMA system, it must ramp up and ramp down during every 30 ms TDM slot interval. In a pulse shaping filter, the filter is normally initialized with zeros, and the natural ramp up takes a delay of eight (in this instance) symbols to realize the first information point. The natural ramp down also takes eight zeros (at the sampling rate) to ramp the filter down in a spectrally efficient way. Sacrificing eight leading and eight trailing symbol periods in a 120 symbol slot interval to control bandwidth is undesirably wasteful of system and information data bandwidth. One way to improve the efficiency of the design is to truncate the eight symbol periods to a lesser number of symbol periods at the beginning and end of a slot. In the preferred embodiment, the ramp times are truncated to two symbol periods for both the ramp-up and ramp-down periods. The effect of truncating these periods is to generate out of band spectral energy splatter. The present invention reduces this splatter while preserving the data bandwidth efficiency.

The assignee of the present invention has already filed a co-pending patent pplication for an improved Nyquist filter design. The application is Ser. No. 09/302,078 and entitled IMPROVED NYQUIST FILTER AND METHOD, which was filed in the US Patent Office on Apr. 28, 1999, the contents of which are hereby incorporated by reference thereto.

Figure 9:
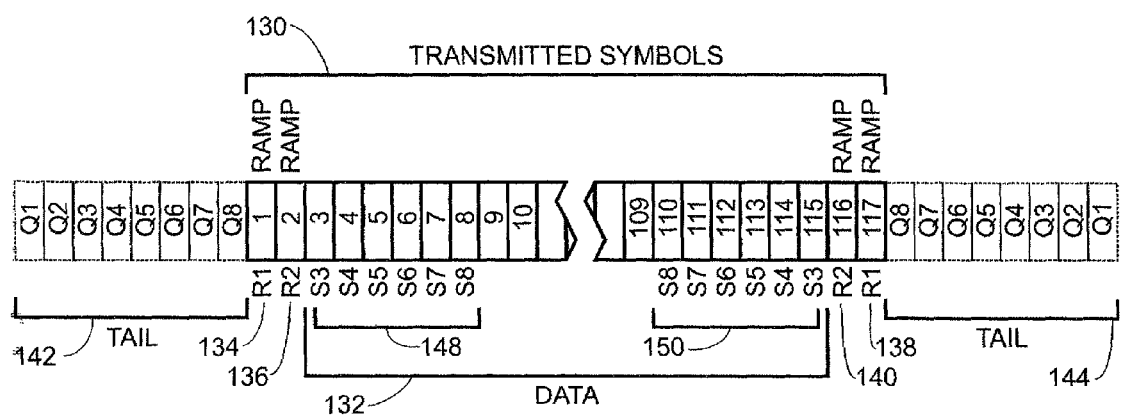
FIG. 9 is a diagram of the adaptive data ramp symbol packet structure according to the present invention.

Reference is directed to FIG. 9, which is a data timing diagram of a single TDMA data slot in the preferred embodiment of the present invention. The transmitted symbols 130 comprise symbols one through one hundred seventeen. Symbols one 134 and two 136 are used to ramp-up the digital filter in the time domain. Symbols one hundred sixteen 140 and one hundred seventeen 138 are used to ramp down the digital filter in the time domain (the other natural ramp symbols having been truncated by design). Note that these symbols are generally described as the ramp symbols. The present invention teaches and claims an apparatus and method of generating ramp data values that reduce energy in the truncated tail of a digital filter.

The preferred embodiment digital filter operates on four-bit symbols with an over sampling rate of sixty-five times. A modified Nyquist filter is employed and the time domain impulse curve is such that eight data symbols is sufficient to provide adequate guard band splatter control. However, for protocol efficiency, the prior art filter utilizes two zero-valued ramp-up and ramp-down data fields with windowing to more quickly ramp the filter and allow for twelve additional useful data symbol periods.

The truncated ramp-up tail 142 is comprised of data symbols Q1, Q2, Q3, Q4, Q5, Q6, Q7, and Q8. Similarly, the truncated ramp-down tail 144 comprises symbols Q8, Q7, Q6, Q5, Q4, Q3, Q2, and Q1. The ramp symbols do not carry useful data. In the present invention, the first six data symbols 148 and the last six data symbols 150 (identified as symbols S3, S4, S5, S6, S7, and S8 in FIG. 9) are used to calculate adaptive ramp symbol values designed to reduce the energy level in the truncated tail portions 142 and 144 to a minimun so that out of band energy splatter is minimized. In the prior art, a windowing approach was used to reduce the energy in the truncated tail. An exponential function was used (among other functions, as are understood by those of ordinary skill in the art) to quickly ramp the filter while minimizing the energy in the truncated tails. While this approach is beneficial, it is a fixed scheme and operates independent of the actual data present in the subsequent bit stream 150 and preceding bit steam 148. Since the data present in the bit streams 148 and 150 have an impact on the truncated tail portion of the digital filter, the energy content of the truncated tail even with windowing applied, cannot operate at an optimum.

Figure 10:
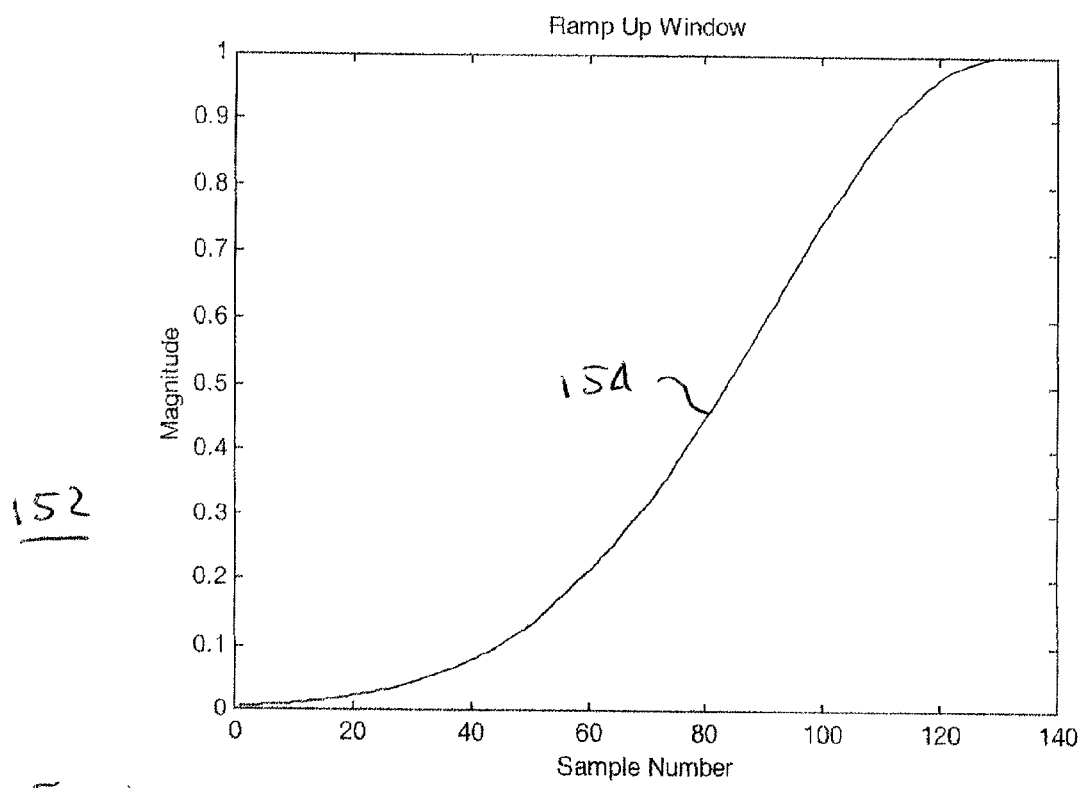
FIG. 10 is a diagram of a ramp-up window in a digital filter.
Figure 11:
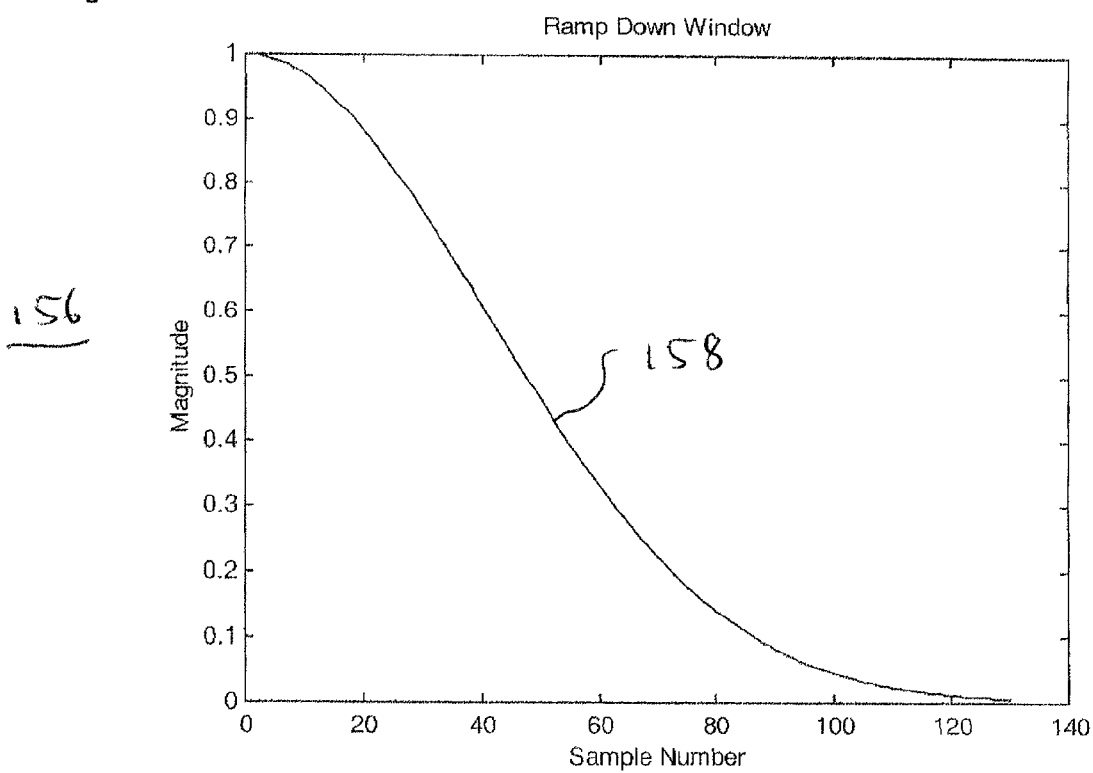
FIG. 11 is a diagram of a ramp-down window in a digital filter.
Figure 12:
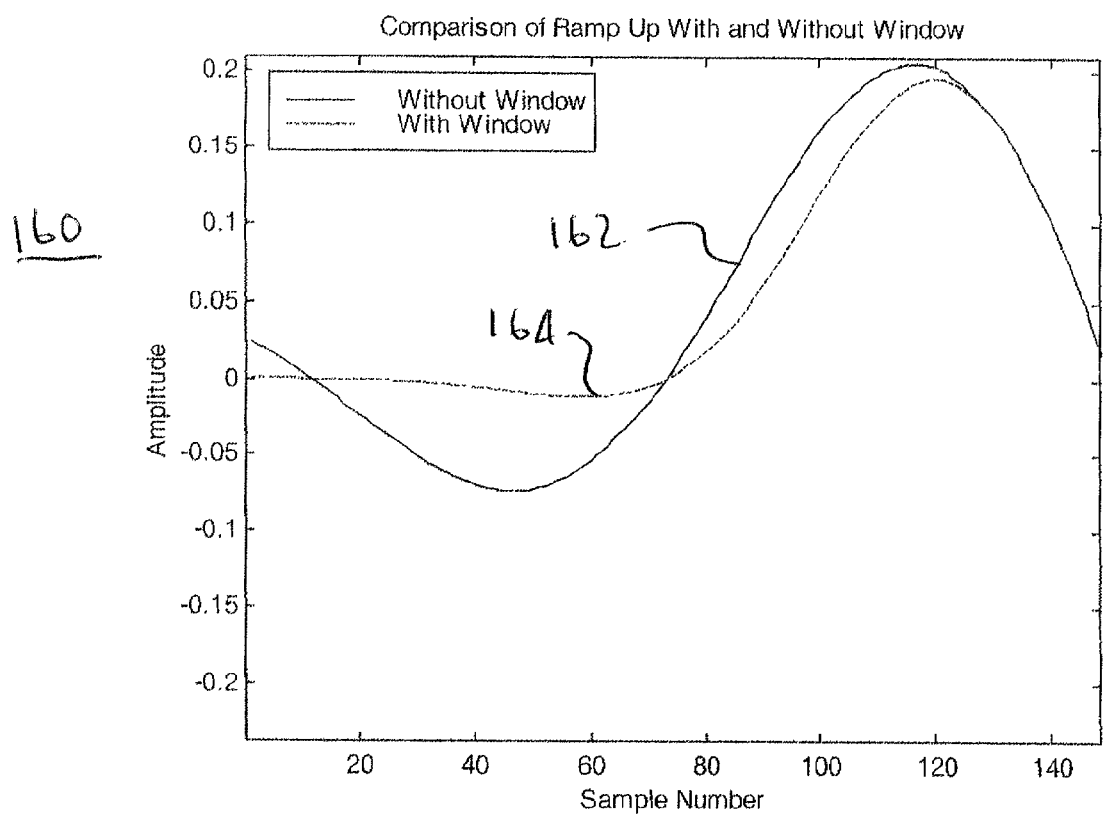
FIG. 12 is a diagram comparing the ramp-up response of a digital filter with and without windowing.
Figure 13:
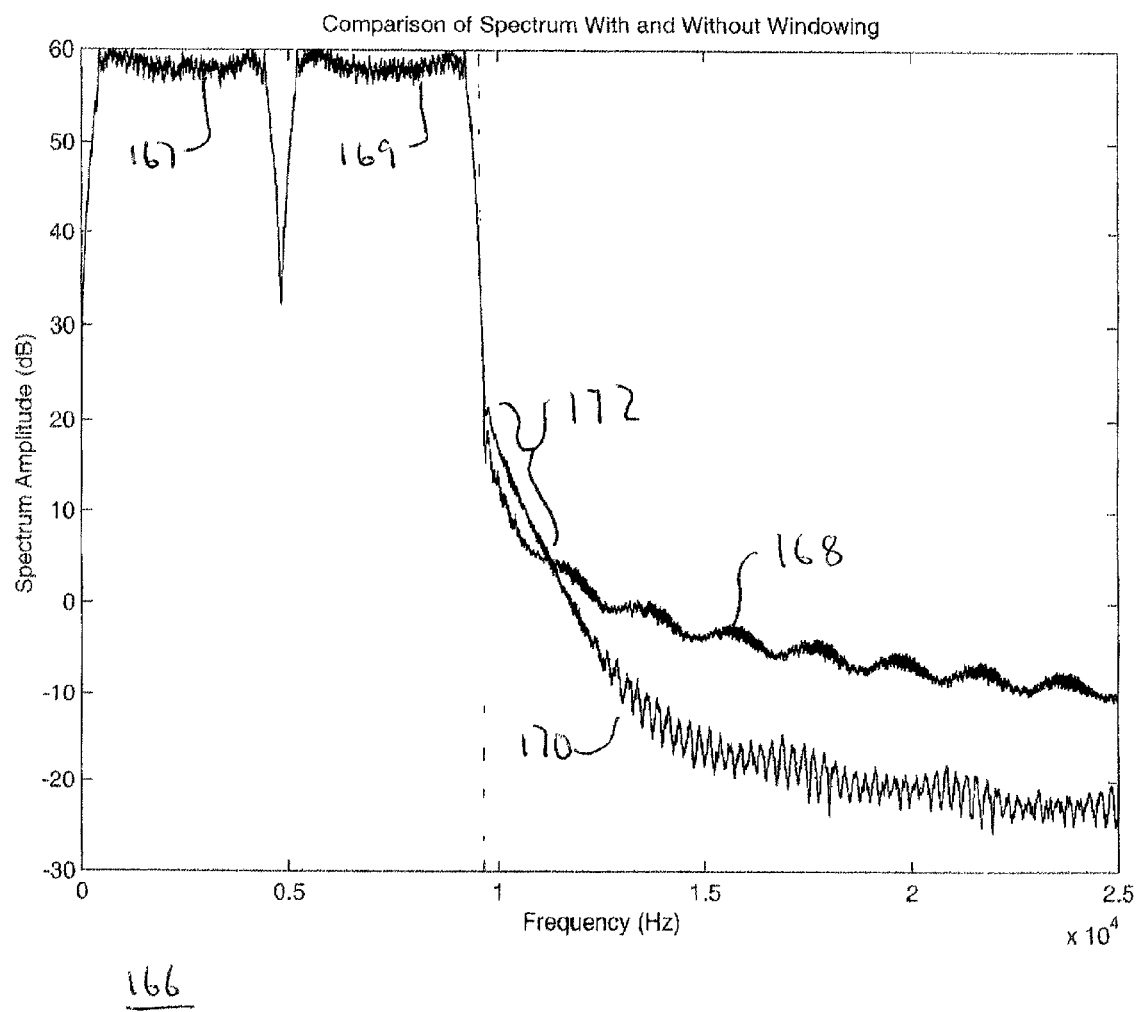
FIG. 13 is a frequency response diagram of a digital filter comparing the ramp-up response with and without windowing.

FIG. 10 shows the ramp-up windowing function magnitude curve 154 as a function of sample points for the first two transmitted data symbol periods. FIG. 11 shows the ramp-down windowing function magnitude curve 158 as a function of sample numbers for the last two transmitted symbol periods. As mentioned above, the prior art windowing function is an exponential function. FIG. 12 shows a comparison of the signal amplitude for an exemplary data stream with and without the windowing function applied to the two-symbol ramp. It can be seen that the frequency amplitude is more efficient in the far stop band in the windowed curve 164 as opposed to the non-windowed curve 162. The benefits of this are clearly visible in FIG. 13, which depicts the spectrum amplitude response 166 as a function of frequency for both the windowed and non-windowed ramp. The pass band response for the two visible sub-channels 167 and 169 show that the filters operate the same in the pass band. In the stop band, the windowed curve 170, with zero ramp symbols, shows a significant improvement in rejection performance (about 10 dB). However, in the transitional area indicated by region 172 in FIG. 13, it can be seen that the windowed ramp actually under performs the non-windowed ramp. As will be appreciated by those skilled in the art, the transitional area is of great importance in system design because it is this region that typically encroaches on the mandated spectral envelope.

The present invention improves upon not only the non-windowed ramp, but the windowed ramp as well, by adapting the ramp symbol values to the transmitted symbol data. The energy in the truncated tail can be minimized and spectral splatter attenuated. A descriptive and mathematical analysis of this approach follows. Reference is directed again to FIG. 9 for an understanding of where the various symbol periods fall in time with respect to one another. The following analysis is with respect to the ramp-up ramp, however, those of ordinary skill in the art will appreciate that the ramp-down ramp is merely a mirror image of the ramp-up ramp, and hence the analysis is complete for both ramps; however, the design can be easily extended to filters with non-symmetrical, or complex response.

In the preferred embodiment, the total energy in the tail can be written using the first eight symbols periods (and last eight symbol periods). Of course, in other filter designs, the number of periods may vary as well as the over sampling rate, as is understood by those of ordinary skill in the art. At 65 times over sampling, the magnitudes of each sample point in the truncated tail portion 142 is contained in one of the following vectors, (where $Q_x$ is the symbol period of data points, $R_x$ (or $S_x$) is the symbol value of the corresponding transmitted data, and $h_y$ is the filter tap, or coefficient, value.

The first truncated symbol period sample data output is determined by the first 65 data sample points:

$$\vec{Q}_1 = \begin{Bmatrix} h_0 R_1 \\ h_1 R_1 \\ \vdots \\ h_{64} R_1 \end{Bmatrix} \quad \text{Eq. 1}$$

The second truncated symbol period sample data output is determined by the next 65 data sample points:

$$\vec{Q}_2 = \begin{Bmatrix} h_{65} R_1 + h_0 R_2 \\ h_{66} R_1 + h_1 R_2 \\ \vdots \\ h_{129} R_1 + h_{64} R_2 \end{Bmatrix} \quad \text{Eq. 2}$$

The third truncated symbol period sample data output is determined by the third 65 data sample points:

$$\vec{Q}_3 = \begin{Bmatrix} h_{130} R_1 + h_{65} R_2 + h_0 S_3 \\ h_{131} R_1 + h_{66} R_2 + h_1 S_3 \\ \vdots \\ h_{194} R_1 + h_{129} R_2 + h_{64} S_3 \end{Bmatrix} \quad \text{Eq. 3}$$

The fourth truncated symbol period sample data output is determined by the fourth 65 data sample points:

$$\vec{Q}_4 = \begin{Bmatrix} h_{195} R_1 + h_{130} R_2 + h_{65} S_3 + h_0 S_4 \\ h_{196} R_1 + h_{131} R_2 + h_{66} S_3 + h_1 S_4 \\ \vdots \\ h_{259} R_1 + h_{194} R_2 + h_{129} S_3 + h_{64} S_4 \end{Bmatrix} \quad \text{Eq. 4}$$

The fifth truncated symbol period sample data output is determined by the fifth 65 data sample points:

$$\vec{Q}_5 = \begin{Bmatrix} h_{260} R_1 + h_{195} R_2 + h_{130} S_3 + h_{65} S_4 + h_0 S_5 \\ h_{261} R_1 + h_{196} R_2 + h_{131} S_3 + h_{66} S_4 + h_1 S_5 \\ \vdots \\ h_{324} R_1 + h_{259} R_2 + h_{194} S_3 + h_{129} S_4 + h_{64} S_5 \end{Bmatrix} \quad \text{Eq. 5}$$

The sixth truncated symbol period sample data output is determined by the sixth 65 data sample points:

$$\vec{Q}_6 = \begin{Bmatrix} h_{325} R_1 + h_{260} R_2 + h_{195} S_3 + h_{130} S_4 + h_{65} S_5 +, h_0 S_6 \\ h_{326} R_1 + h_{261} R_2 + h_{196} S_3 + h_{131} S_4 + h_{66} S_5 + h_1 S_6 \\ \vdots \\ h_{389} R_1 + h_{324} R_2 + h_{259} S_3 + h_{194} S_4 +, h_{129} S_5 + h_{64} S_6 \end{Bmatrix} \quad \text{Eq. 6}$$

The seventh truncated symbol period sample data output is determined by the seventh 65 data sample points:

$$\vec{Q}_7 = \quad \text{Eq. 7}$$

$$\begin{Bmatrix} h_{390} R_1 + h_{325} R_2 + h_{269} S_3 + h_{195} S_4 + h_{130} S_5 + h_{65} S_6 + h_0 S_7 \\ h_{391} R_1 + h_{326} R_2 + h_{270} S_3 + h_{195} S_4 + h_{131} S_5 + h_{66} S_6 + h_1 S_7 \\ \vdots \\ h_{454} R_1 + h_{389} R_2 + h_{324} S_3 + h_{259} S_4 + h_{194} S_5 + h_{129} S_6 + h_{64} S_7 \end{Bmatrix}$$

The eighth truncated symbol period sample data output is determined by the eighth 65 data sample points:

$$\vec{Q}_8 = \begin{Bmatrix} h_{455}R_1 + h_{390}R_2 + h_{325}S_3 + h_{260}S_4 + h_{195}S_5 + h_{130}S_6 + h_{64}S_7 + h_0S_8 \\ h_{456}R_1 + h_{391}R_2 + h_{326}S_3 + h_{261}S_4 + h_{196}S_5 + h_{131}S_6 + h_{65}S_7 + h_1S_8 \\ \vdots \\ h_{519}R_1 + h_{454}R_2 + h_{389}S_3 + h_{324}S_4 + h_{259}S_5 + h_{194}S_6 + h_{129}S_7 + h_{64}S_8 \end{Bmatrix} \quad \text{Eq. 8}$$

The sum of the squares for each of the sixty-five sample points of the eight truncated symbol periods indicates the total energy in the truncated tail as follows:

$$E = \sum_{i=0}^{64} (Q_{1_i}^2 + Q_{2_i}^2 + Q_{3_i}^2 + Q_{4_i}^2 + Q_{5_i}^2 + Q_{6_i}^2 + Q_{7_i}^2 + Q_{8_i}^2) \quad \text{Eq. 9}$$

The ramp up symbol values are calculated by solving the least squares to minimize the amount of energy in the truncated tail symbols. The partial derivative of the energy with respect to the two ramp symbols are taken to accomplish this step, as follows:

Respecting Symbol $R_1$: $\frac{\partial E}{\partial R_1} =$ $$\sum_{i=0}^{64} \left( 2\frac{\partial Q_{1_i}}{\partial R_1}Q_{1_i} + 2\frac{\partial Q_{2_i}}{\partial R_1}Q_{2_i} + \ldots + 2\frac{\partial Q_{8_i}}{\partial R_1}Q_{8_i} \right) \quad \text{Eq. 10}$$

and

Respecting Symbol $R_2$: $\frac{\partial E}{\partial R_2} =$ $$\sum_{i=0}^{64} \left( 2\frac{\partial Q_{1_i}}{\partial R_2}Q_{1_i} + 2\frac{\partial Q_{2_i}}{\partial R_2}Q_{2_i} + \ldots + 2\frac{\partial Q_{8_i}}{\partial R_2}Q_{8_i} \right) \quad \text{Eq. 11}$$

For clarity and simplicity, the individual terms contributing to the energy in $R_1$ and $R_2$ in the above equations with respect to each vector are individually expressed, and appear below for both $R_1$ and $R_2$ for each term of Equations Eq. 10 and Eq. 11.

First term for Eq. 10 and Eq. 11 respectively:

$$\sum_{l=0}^{64} \frac{\partial Q_{1_l}^2}{\partial R_1} = 2\sum_{l=0}^{64} \frac{\partial Q_{1_l}}{\partial R_1}Q_{1_l} = 2\left(\sum_{l=0}^{64} h_l^2\right)R_1 \quad \text{Eq. 12}$$

and $$\sum_{l=0}^{64} \frac{\partial Q_{1_l}}{\partial R_2}Q_{1_l} = 0 \quad \text{Eq. 13}$$

as there is no $R_2$ argument in the first term.

Second term for Eq. 10 and Eq. 11 respectively:

$$2\frac{\partial \vec{Q}_2}{\partial R_1} \cdot \vec{Q}_2 = 2\left\{ \left[\sum_{l=0}^{64} (h_{l+65})(h_l)\right]R_2 + \left[\sum_{l=0}^{64} (h_{l+65})^2\right]R_1 \right\} \quad \text{Eq. 14}$$

and $$2\frac{\partial \vec{Q}_2}{\partial R_2} \cdot \vec{Q}_2 = 2\left\{ \left[\sum_{l=0}^{64} (h_{l+65})(h_l)\right]R_1 + \left[\sum_{l=0}^{64} h_l^2\right]R_2 \right\} \quad \text{Eq. 15}$$

Third term for Eq. 10 and Eq. 11 respectively:

$$2\frac{\partial \vec{Q}_3}{\partial R_1} \cdot \vec{Q}_3 = 2\left\{ \left[\sum_{l=0}^{64} h_{l+130}^2\right]R_1 + \left[\sum_{l=0}^{64} (h_{l+65})(h_{l+130})\right]R_2 + \left[\sum_{l=0}^{64} (h_{l+130})(h_l)\right]S_3 \right\} \quad \text{Eq. 16}$$

and $$2\frac{\partial \vec{Q}_3}{\partial R_2} \cdot \vec{Q}_3 = 2\left\{ \left[\sum_{l=0}^{64} (h_{l+130})(h_{l+65})\right]R_1 + \left[\sum_{l=0}^{64} h_{l+65}^2\right]R_2 + \left[\sum_{l=0}^{64} (h_{l+65})(h_l)\right]S_3 \right\} \quad \text{Eq. 17}$$

Fourth term for Eq. 10 and Eq. 11 respectively:

$$2\frac{\partial \vec{Q}_4}{\partial R_1} \cdot \vec{Q}_4 = 2\left\{\begin{array}{l}\left[\sum_{l=0}^{64} h_{l+195}^2\right]R_1 + \left[\sum_{l=0}^{64}(h_{l+195})(h_{l+130})\right]R_2 + \left[\sum_{l=0}^{64}(h_{l+195})(h_{l+65})\right]S_3 + \\ \left[\sum_{l=0}^{64}(h_l)(h_{l+195})\right]S_4\end{array}\right\} \quad \text{Eq. 18}$$

and $$2\frac{\partial \vec{Q}_4}{\partial R_2} \cdot \vec{Q}_4 = 2\left\{\begin{array}{l}\left[\sum_{l=0}^{64}(h_{l+195})(h_{l+130})\right]R_1 + \left[\sum_{l=0}^{64} h_{l+130}^2\right]R_2 + \left[\sum_{l=0}^{64}(h_{l+130})(h_{l+65})\right]S_3 + \\ \left[\sum_{l=0}^{64}(h_{l+130})(h_l)\right]S_4\end{array}\right\} \quad \text{Eq. 19}$$

Fifth term for Eq. 10 and Eq. 11 respectively:

$$2\frac{\partial \vec{Q}_5}{\partial R_1} \cdot \vec{Q}_5 = 2\left\{\begin{array}{l}\left[\sum_{l=0}^{64} h_{l+260}^2\right]R_1 + \left[\sum_{l=0}^{64}(h_{l+260})(h_{l+195})\right]R_2 + \left[\sum_{l=0}^{64}(h_{l+260})(h_{l+130})\right]S_3 + \\ \left[\sum_{l=0}^{64}(h_{l+260})(h_{l+65})\right]S_4 + \left[\sum_{l=0}^{64}(h_{l+260})(h_l)\right]S_5\end{array}\right\} \quad \text{Eq. 20}$$

and $$2\frac{\partial \vec{Q}_5}{\partial R_2} \cdot \vec{Q}_5 = 2\left\{\begin{array}{l}\left[\sum_{l=0}^{64}(h_{l+260})(h_{l+195})\right]R_1 + \left[\sum_{l=0}^{64} h_{l+195}^2\right]R_2 + \left[\sum_{l=0}^{64}(h_{l+195})(h_{l+130})\right]S_3 + \\ \left[\sum_{l=0}^{64}(h_{l+195})(h_{l+65})\right]S_4 + \left[\sum_{l=0}^{64}(h_{l+195})(h_l)\right]S_5\end{array}\right\} \quad \text{Eq. 21}$$

Sixth term for Eq. 10 and Eq. 11 respectively:

$$2\frac{\partial \vec{Q}_6}{\partial R_1} \cdot \vec{Q}_6 = 2\left\{\begin{array}{l}\left[\sum_{l=0}^{64} h_{l+325}^2\right]R_1 + \left[\sum_{l=0}^{64}(h_{l+325})(h_{l+260})\right]R_2 + \left[\sum_{l=0}^{64}(h_{l+325})(h_{l+195})\right]S_3 + \\ \left[\sum_{l=0}^{64}(h_{l+325})(h_{l+130})\right]S_4 + \left[\sum_{l=0}^{64}(h_{l+325})(h_{l+65})\right]S_5 + \left[\sum_{l=0}^{64}(h_{l+325})(h_l)\right]S_6\end{array}\right\} \quad \text{Eq. 2}$$

and $$2\frac{\partial \vec{Q}_6}{\partial R_2} \cdot \vec{Q}_6 = 2\left\{\begin{array}{l}\left[\sum_{l=0}^{64}(h_{l+325})(h_{l+260})\right]R_1 + \left[\sum_{l=0}^{64} h_{l+260}^2\right]R_2 + \left[\sum_{l=0}^{64}(h_{l+260})(h_{l+195})\right]S_3 + \\ \left[\sum_{l=0}^{64}(h_{l+260})(h_{l+130})\right]S_4 + \left[\sum_{l=0}^{64}(h_{l+260})(h_{l+65})\right]S_5 + \left[\sum_{l=0}^{64}(h_{l+260})(h_l)\right]S_6\end{array}\right\} \quad \text{Eq. 2}$$

Seventh term for Eq. 10 and Eq. 11 respectively:

$$2\frac{\partial \vec{Q}_7}{\partial R_1} \cdot \vec{S}_7 = 2\left\{\begin{array}{l}\left[\sum_{l=0}^{64} h_{l+390}^2\right]R_1 + \left[\sum_{l=0}^{64}(h_{l+390})(h_{l+325})\right]R_2 + \left[\sum_{l=0}^{64}(h_{l+390})(h_{l+260})\right]S_3 + \\ \left[\sum_{l=0}^{64}(h_{l+390})(h_{l+195})\right]S_4 + \left[\sum_{l=0}^{64}(h_{l+390})(h_{l+130})\right]S_5 + \left[\sum_{l=0}^{64}(h_{l+390})(h_{l+65})\right]S_6 + \\ \left[\sum_{l=0}^{64}(h_{l+390})(h_l)\right]S_7\end{array}\right\} \quad \text{Eq. 24}$$

and $$2\frac{\partial \vec{Q}_7}{\partial R_2} \cdot \vec{Q}_7 = 2\left\{\begin{array}{l}\left[\sum_{l=0}^{64}(h_{l+390})(h_{l+325})\right]R_1 + \left[\sum_{l=0}^{64} h_{l+325}^2\right]R_2 + \left[\sum_{l=0}^{64}(h_{l+325})(h_{l+260})\right]S_3 + \\ \left[\sum_{l=0}^{64}(h_{l+325})(h_{l+195})\right]S_4 + \left[\sum_{l=0}^{64}(h_{l+325})(h_{l+130})\right]S_5 + \left[\sum_{l=0}^{64}(h_{l+325})(h_{l+65})\right]S_6 + \\ \left[\sum_{l=0}^{64}(h_{l+325})(h_l)\right]S_7\end{array}\right\} \quad \text{Eq. 25}$$

Eighth term for Eq. 10 and Eq. 11 respectively:

$$2\frac{\partial \vec{Q}_8}{\partial R_1} \cdot \vec{Q}_8 = 2\left\{\begin{array}{l}\left[\sum_{l=0}^{64} h_{l+455}^2\right]R_1 + \left[\sum_{l=0}^{64}(h_{l+455})(h_{l+390})\right]R_2 + \left[\sum_{l=0}^{64}(h_{l+455})(h_{l+325})\right]S_3 + \\ \left[\sum_{l=0}^{64}(h_{l+455})(h_{l+260})\right]S_4 + \left[\sum_{l=0}^{64}(h_{l+455})(h_{l+195})\right]S_5 + \left[\sum_{l=0}^{64}(h_{l+455})(h_{l+130})\right]S_6 + \\ \left[\sum_{l=0}^{64}(h_{l+455})(h_{l+65})\right]S_7 + \left[\sum_{l=0}^{64}(h_{l+455})(h_l)\right]S_8\end{array}\right\} \quad \text{Eq. 26}$$

and $$2\frac{\partial \vec{Q}_8}{\partial R_2} \cdot \vec{Q}_8 = 2\left\{\begin{array}{l}\left[\sum_{l=0}^{64}(h_{l+455})(h_{l+390})\right]R_1 + \left[\sum_{l=0}^{64} h_{l+390}^2\right]R_2 + \left[\sum_{l=0}^{64}(h_{l+390})(h_{l+325})\right]S_3 + \\ \left[\sum_{l=0}^{64}(h_{l+390})(h_{l+260})\right]S_4 + \left[\sum_{l=0}^{64}(h_{l+390})(h_{l+195})\right]S_5 + \left[\sum_{l=0}^{64}(h_{l+390})(h_{l+130})\right]S_6 + \\ \left[\sum_{l=0}^{64}(h_{l+390})(h_{l+65})\right]S_7 + \left[\sum_{l=0}^{64}(h_{l+390})(h_l)\right]S_8\end{array}\right\} \quad \text{Eq. 27}$$

The sum of all derivative terms is zero, giving two equations and two unknowns, for the least squares. The sample points are summed and organized to yield the following:

$$\left(\sum_{l=0}^{519} h_l^2\right)R_1 + \left(\sum_{l=0}^{454} h_l h_{l+65}\right)R_2 + \left(\sum_{l=0}^{389} h_l h_{l+130}\right)S_3 + \left(\sum_{l=0}^{324} h_l h_{l+195}\right)S_4 + \\ \left(\sum_{l=0}^{259} h_l h_{l+260}\right)S_5 + \left(\sum_{l=0}^{194} h_l h_{l+325}\right)S_6 + \left(\sum_{l=0}^{129} h_l h_{l+390}\right)S_7 + \left(\sum_{l=0}^{64} h_l h_{l+455}\right)S_8 = 0 \quad \text{Eq. 28}$$

and

-continued $$\left(\sum_{l=0}^{454} h_l h_{l+65}\right) R_1 + \left(\sum_{l=0}^{454} h_l^2\right) R_2 + \left(\sum_{l=0}^{389} h_l h_{l+65}\right) S_3 + \left(\sum_{l=0}^{324} h_l h_{l+130}\right) S_4 +$$
$$\left(\sum_{l=0}^{259} h_l h_{l+195}\right) S_5 + \left(\sum_{l=0}^{194} h_l h_{l+260}\right) S_6 + \left(\sum_{l=0}^{129} h_l h_{l+325}\right) S_7 + \left(\sum_{l=0}^{64} h_l h_{l+390}\right) S_8 = 0 \quad \text{Eq. 29}$$

Which is simplified by setting a variable equal to the summation terms, and rewritten as:

$$\alpha_{11} R_1 + \alpha_{12} R_2 = -c_{11} S_3 - c_{12} S_4 - c_{13} S_5 - c_{14} S_6 - c_{15} S_7 - c_{16} S_8 \quad \text{Eq. 30}$$

and $$\alpha_{12} R_1 + \alpha_{22} R_2 = -c_{21} S_3 - c_{22} S_4 - c_{23} S_5 - c_{24} S_6 - c_{25} S_7 - c_{26} S_8 \quad \text{Eq. 31}$$

Solving for $R_1$ and $R_2$ and converting to matrix mathematics yields:

$$\begin{bmatrix} R_1 \\ R_2 \end{bmatrix} = \begin{bmatrix} a_{11} & a_{12} \\ a_{12} & a_{22} \end{bmatrix}^{-1} \begin{bmatrix} -c_{11} S_3 & -c_{12} S_4 & -c_{13} S_5 & -c_{14} S_6 & -c_{15} S_7 & -c_{16} S_8 \\ -c_{21} S_3 & -c_{22} S_4 & -c_{23} S_5 & -c_{24} S_6 & -c_{25} S_7 & -c_{26} S_8 \end{bmatrix} \quad \text{Eq. 32}$$

And defining $c'_{xy} = -c_{xy}$, we have:

$$\begin{bmatrix} R_1 \\ R_2 \end{bmatrix} = \begin{bmatrix} a_{11} & a_{12} \\ a_{12} & a_{22} \end{bmatrix}^{-1} \begin{bmatrix} c'_{11} & c'_{12} & c'_{13} & c'_{14} & c'_{15} & c'_{16} \\ c'_{21} & c'_{22} & c'_{23} & c'_{24} & c'_{25} & c'_{26} \end{bmatrix} \begin{bmatrix} S_3 \\ S_4 \\ S_5 \\ S_6 \\ S_7 \\ S_8 \end{bmatrix} \quad \text{Eq. 33}$$

and $$\begin{bmatrix} a_{11} & a_{12} \\ a_{12} & a_{22} \end{bmatrix}^{-1} = \frac{1}{a_{11} a_{22} - a_{12}^2} \begin{bmatrix} a_{22} & -a_{12} \\ -a_{12} & a_{11} \end{bmatrix} = \begin{bmatrix} b_{11} & b_{12} \\ b_{12} & b_{22} \end{bmatrix} \quad \text{Eq. 34}$$

Substituting $b_{xy}$ for like elements in the $a_{xy}^{-1}$ matrix produces Equation 35 below:

$$\begin{bmatrix} R_1 \\ R_2 \end{bmatrix} = \begin{bmatrix} b_{11} c'_{11} + b_{12} c'_{21} & b_{11} c'_{12} + b_{12} c'_{22} & b_{11} c'_{13} + b_{12} c'_{23} & b_{11} c'_{14} + b_{12} c'_{24} & b_{11} c'_{15} + b_{12} c'_{25} & b_{11} c'_{16} + b_{12} c'_{26} \\ b_{12} c'_{11} + b_{22} c'_{21} & b_{12} c'_{12} + b_{22} c'_{22} & b_{12} c'_{13} + b_{22} c'_{23} & b_{12} c'_{14} + b_{22} c'_{24} & b_{12} c'_{15} + b_{22} c'_{25} & b_{12} c'_{16} + b_{22} c'_{26} \end{bmatrix} \begin{bmatrix} S_3 \\ S_4 \\ S_5 \\ S_6 \\ S_7 \\ S_8 \end{bmatrix}$$

This solution can be calculated in the conventional manner. Thus, a set of coefficients can be generated, based on the filter tap coefficients, and stored in a look-up table for use in calculating the ramp-up (and ramp-down) symbols that yield the lowest energy in the truncated tails. Ramp down is the mirror image of ramp up, given filter symmetry.

In operation, as each TDMA data packet is received, the first and last six valid data packets (items 148 and 150 in FIG. 9) are processed according to the stored coefficients and Equation 35 to produce the best fit ramp-up symbols (items 134 and 136 in FIG. 9) as well as the best fit ramp-down symbols (items 140 and 138 in FIG. 9) to minimize energy in the truncated tail portion of the data packet.

Figure 14:
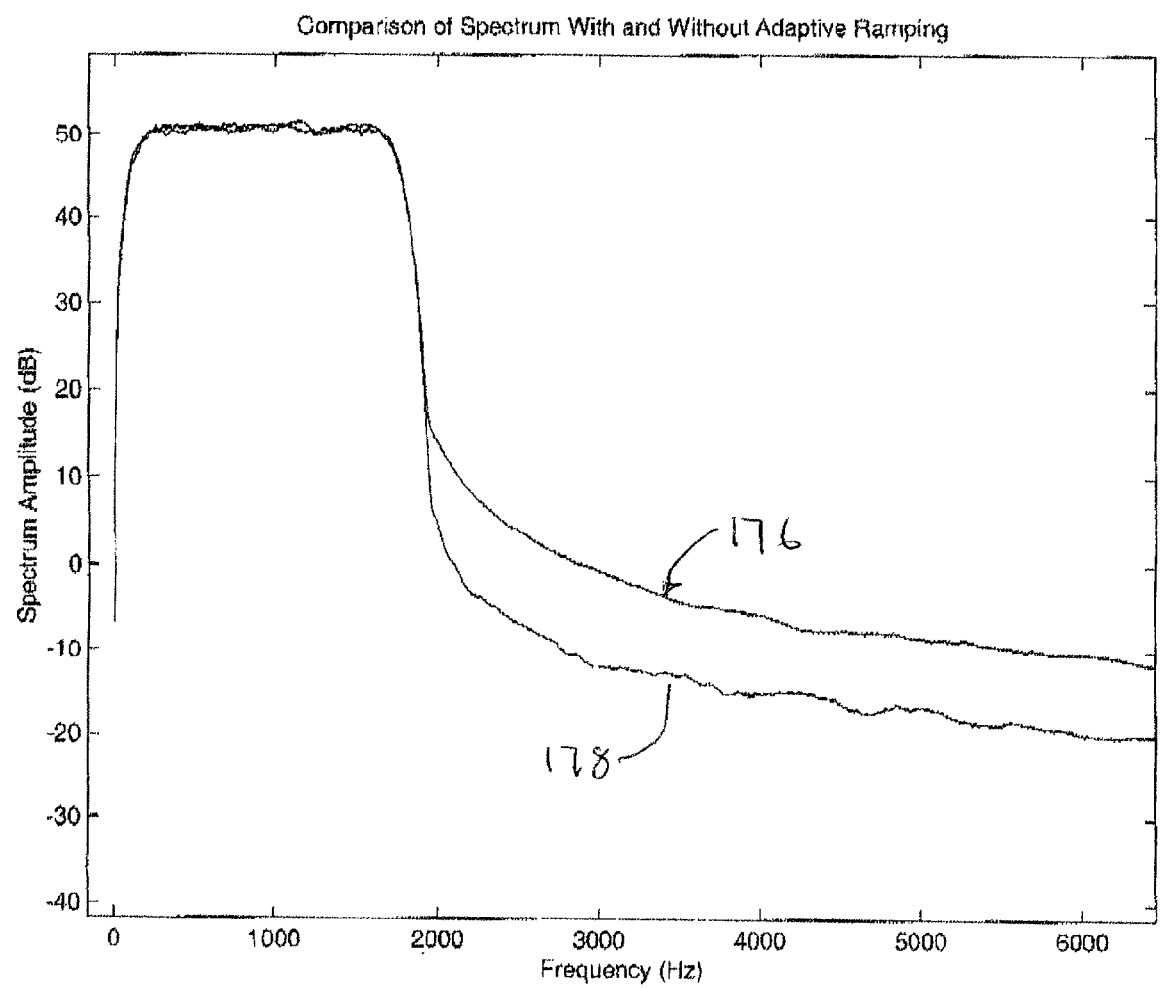
FIG. 14 is a frequency response diagram of a digital filter comparing the ramp-up response with and without adaptive ramping.

The improvement is apparent upon review of FIG. 14. This figure compares a spectrum amplitude curve for a windowed ramp 176, with ramp symbols of zero, with a spectrum amplitude curve for the preferred embodiment adaptive ramp filter 178, which does not have zero ramp symbols. The curves were prepared using MATLAB, based on the preferred embodiment filter design. The improvement in the stop band is approximately 10 dB. This affords designers a greater guard band or the ability to more efficiently utilize spectrum in systems challenged for bandwidth. Note that a properly designed window can make the far out-of-band spectrum almost any attenuation value. The trade-off of doing this is more near-band spectral splatter. With adaptive ramping, no nearby penalty is paid, since the ramp symbols are part of the transmit filter at the symbol rate. Windowing further improves the far out-of-band stop band for adaptive ramping, but the effects to the near-band are not as severe, since the spectral efficiency is better to begin with.

Filters as described herein can be used in a variety of applications. For example, the filters can be used in any system that utilizes pulse shaping filters. Digital communication systems provide one such example. Filters of the present invention could be used in wireless communications (cellular, GSM, microwave, satellite), wired communications (in telephone systems, cable modems), optical systems, broadcast systems (digital television, digital radio, satellite), and others.

Thus, the present invention has been described herein with reference to a particular embodiment for a particular application. It is therefore intended by the appended claims to cover any and all such applications, modifications and embodiments within the scope of the present invention.

Accordingly,

What is claimed is:

1. An apparatus for generating coefficients to reduce the output energy and bandwidth of an intermittent signal, comprising:
   a digital filter, and
   a controller operable to calculate the energy in at least a first truncated tail data field as a function of at least a first ramp data field and at least a first data field, and operable to take a partial derivative of the energy in said at least the first truncated tail data field with respect to said at least the first ramp data field, and operable to generate an equality by setting said partial derivative of the energy equal to zero, and operable to solve said equality for said at least the first ramp data field as a function of said at least the first data field thereby generating at least a first coefficient coupled to said digital filter for reducing the output energy and bandwidth of the intermittent signal.

2. The apparatus of claim 1, wherein said energy in said at least the a first truncated tail data field is also a function of digital filter tap coefficients.

3. A method generating coefficients for reducing the output energy and bandwidth of an intermittent signal in a digital filter, comprising the steps of:
   calculating the energy in at least a first truncated tail data field as a function of at least a first ramp data field variable and at least a first data field variable;
   taking a partial derivative of the energy in said at least the first truncated tail data field with respect to said at least the first ramp data field variable;
   writing an equality by setting said partial derivative of the energy equal to zero;
   solving said equality for said at least the first ramp data field variable as a function of said at least the first data field thereby generating at least a first coefficient, and
   coupling said first coefficient to the digital filter for reducing the output energy and bandwidth of the intermittent signal.

4. The method of claim 3, wherein said energy in said at least the first truncated tail data field is also a function of digital filter tap coefficients.

* * * * *